(12) United States Patent
Peng et al.

(10) Patent No.: US 12,034,574 B1
(45) Date of Patent: Jul. 9, 2024

(54) FEED-FORWARD EQUALIZER AND VOLTAGE-MODE SIGNAL TRANSMITTER USING SAME

(71) Applicant: National Tsing Hua University, Hsinchu (TW)

(72) Inventors: Pen-Jui Peng, Hsinchu (TW); Yan Ting Chen, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 16 days.

(21) Appl. No.: 18/179,373

(22) Filed: Mar. 7, 2023

(30) Foreign Application Priority Data

Dec. 28, 2022 (TW) .................................. 111150386

(51) Int. Cl.
*H04L 25/03* (2006.01)
*H03K 3/012* (2006.01)
*H03K 17/687* (2006.01)
*H04L 27/01* (2006.01)

(52) U.S. Cl.
CPC ....... *H04L 25/03878* (2013.01); *H03K 3/012* (2013.01); *H03K 17/6874* (2013.01); *H04L 27/01* (2013.01)

(58) Field of Classification Search
CPC ............................................... H04L 25/03878
USPC ....................................................... 327/108
See application file for complete search history.

(56) References Cited

U.S. PATENT DOCUMENTS 9,942,030 B1 * 4/2018 Dickson ................ H04L 7/0337
11,057,247 B2 7/2021 Dong

FOREIGN PATENT DOCUMENTS

| CN | 104333524 | 7/2017 |
| TW | I687046 | 3/2020 |
| WO | 2018119153 | 6/2018 |

OTHER PUBLICATIONS

Pen-Jui Peng et al., "A 112Gb/s PAM-4 Voltage-Mode Transmitter with 4-Tap Two-Step FFE and Automatic Phase Alignment Techniques in 40nm CMOS", 2019 IEEE International Solid-State Circuits Conference, Feb. 18, 2019, pp. 124-126.

(Continued)

*Primary Examiner* — Tomi Skibinski
(74) *Attorney, Agent, or Firm* — JCIPRNET

(57) ABSTRACT

A feed-forward equalizer (FFE) and a voltage-mode signal transmitter using the same are provided. The FFE includes an output, a plurality of tap drivers, and a control circuit. Each tap driver includes a cell driver. The control circuit includes a FFE control loop and an impedance control loop. The FFE control loop includes a first replica circuit corresponding to a part of the cell drivers. The FFE control loop generates at least one first reference voltage according to the first replica circuit. The impedance control loop includes a second replica circuit corresponding to the cell drivers in the tap drivers. The impedance control loop generates at least one second reference voltage according to the first reference voltage and the second replica circuit. The tap drivers are controlled by the first and second reference voltages to adjust respective output impedance thereof.

12 Claims, 7 Drawing Sheets

(56) References Cited

OTHER PUBLICATIONS

"Office Action of Taiwan Counterpart Application", issued on Aug. 7, 2023, p. 1-p. 4.
Yan-Ting Chen et al., "A 100-GB/s PAM-4 Voltage-Mode Transmitter With High-Resolution Unsegmented Three-Tap FFE in 40-nm CMOS", IEEE Solid-State Circuits Letters ( vol. 5), Aug. 29, 2022 , pp. 218-221.

* cited by examiner

FEED-FORWARD EQUALIZER AND VOLTAGE-MODE SIGNAL TRANSMITTER USING SAME

CROSS-REFERENCE TO RELATED APPLICATION

This application claims the priority benefit of Taiwanese application no. 111150386, filed on Dec. 28, 2022. The entirety of the above-mentioned patent application is hereby incorporated by reference herein and made a part of this specification.

BACKGROUND

Technical Field

The disclosure relates to signal transception technology of wired communication. Particularly, the disclosure relates to a feed-forward equalizer and a voltage-mode signal transmitter using the same.

Description of Related Art

Wired communication is transmission of signals between a transmitter (TX) at the transmitting end and a receiver (RX) at the receiving end. In addition, a transmitter using a voltage-mode driver is widely used due to relatively good trade-off between output swing and linearity in a low-supply system.

However, when realizing functions of a feed-forward equalizer (FFE) of the voltage-mode driver, the transmitter is required to be segmented into several cell drivers according to the resolution of the FFE, which may reduce the output bandwidth of the voltage-mode driver and increase the input loading of the voltage-mode driver, affecting the maximum bandwidth of the transmitter and increasing the power consumption.

SUMMARY

The disclosure provide a feed-forward equalizer and a voltage-mode signal transmitter using the same, addressing the needs to segment a driving circuit for coefficient control of the feed-forward equalizer in the signal transmitter, and achieving a relatively good output bandwidth and relatively good resolution of the feed-forward equalizer with relatively low power consumption.

An embodiment of the disclosure provides a feed-forward equalizer adapted for a voltage-mode signal transmitter. The feed-forward equalizer includes an output, a plurality of tap drivers, and a control circuit. Outputs of the tap drivers are coupled to the output. Each of the tap drivers includes a cell driver. The control circuit is coupled to the cell driver in each of the tap drivers. The control circuit includes a feed-forward equalizer control loop and an impedance control loop. The feed-forward equalizer control loop includes a first replica circuit corresponding to the cell driver comprised in a part of the tap drivers. The feed-forward equalizer control loop generates at least one first reference voltage according to the first replica circuit. The part of the tap drivers is controlled by the at least one first reference voltage to adjust respective output impedance thereof. The impedance control loop includes a second replica circuit corresponding to the cell drivers in the tap drivers. The impedance control loop generates at least one second reference voltage according to the at least one first reference voltage and the second replica circuit. Another part of the tap drivers is controlled by the at least one second reference voltage to adjust respective output impedance thereof.

An embodiment of the disclosure provides a voltage-mode signal transmitter, which includes the feed-forward equalizer described above.

Based on the foregoing, according to an embodiment of the disclosure, the FFE and the voltage-mode signal transmitter using the same achieve FFE coefficient adjustment and also driver output impedance correction by the control circuit, reducing the number of cell drivers in the FFE. In other words, in an embodiment of the disclosure, FFE coefficient control is integrated into the impedance control loop in the control circuit, which prevents segmentation of the driver into several cell drivers to control the FFE coefficient. Moreover, resolution of the FFE coefficient is not limited by the bandwidth of the driver and the power consumption of the transmitter.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

In voltage-mode transmitter technology, a front-end circuit for high-speed processing is split into three groups of identical tap drivers, and outputs of these tap drivers are combined with each other at an output of the transmitter to generate the required modulation signal (e.g., a 4-order pulse amplitude modulation signal). Each tap driver is further segmented into smaller cell drivers, and control units of the transmitter may adjust a coefficient of a feed-forward equalizer (FFE) by controlling these cell drivers.

Taking a 3-tap 6-bit FFE as an example, each circuit block may be segmented into 189 (($2^6-1$)×3) cell drivers. As a result of such segmentation, the number of cell drivers in the entire transmitter may include 567 (189× 3) cell drivers. Such a large number of unit cell drivers may not only aggravate the loading effect of the circuit layout, but may also increase the self-loading effect of the transmitter, reducing the output bandwidth of the transmitter and increasing the power consumption.

In an embodiment of the disclosure, FFE coefficient control is integrated into an impedance control loop in a control circuit, which prevents segmentation of the driver into several cell drivers to control the FFE coefficient. In an embodiment of the disclosure, the control circuit may be divided into two sub-circuits, namely, an FFE control loop and an impedance control loop. In an embodiment of the disclosure, output impedance of tap drivers other than a main-tap driver (e.g., a pre-tap driver and a post-tap driver) is adjusted by the FFE control loop. Next, all the tap drivers (including the main-tap driver, the pre-tap controller, and the post-tap controller) are copied together with a reference voltage for adjusting impedance to the impedance control loop. Then, in an embodiment of the disclosure, the reference voltage of the main-tap driver is adjusted by the impedance control loop to lock the impedance of the overall driver to an expected value.

In this way, it is not required to further segment and subdivide each tap driver into a plurality of cell drivers. If an embodiment of the disclosure is realized a 3-tap 6-bit FFE, the number of cell drivers in the entire transmitter may be reduced from 567 to 9, which optimizes the output bandwidth and energy efficiency of the transmitter.

As a result, in an embodiment of the disclosure, the FFE and the transmitter using the FFE achieve FFE coefficient adjustment and also driver output impedance correction by the control circuit. Moreover, resolution of the FFE coefficient is not limited by the bandwidth of the driver and the power consumption of the transmitter. Detailed description according to the corresponding embodiments of the disclosure will be provided below.

Figure 1:
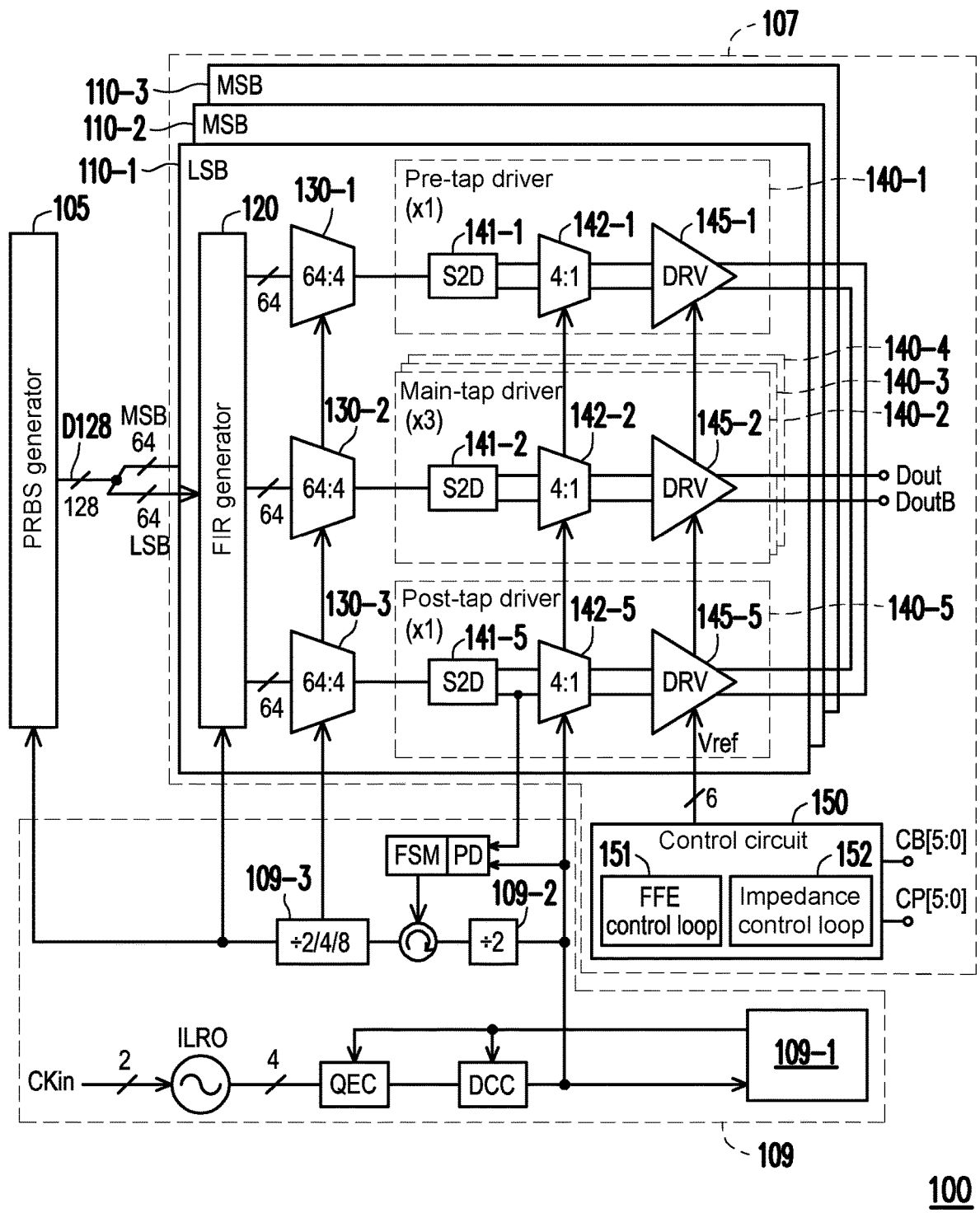
FIG. 1 is a circuit block diagram of a voltage-mode transmitter according to an embodiment of the disclosure.

FIG. 1 is a circuit block diagram of a voltage-mode transmitter 100 according to an embodiment of the disclosure. In this embodiment, the transmitter 100 includes a pseudo-random bit sequence (PRBS) generator 105, a feed-forward equalizer (FFE) 107, and a transmitter control circuit 109. The voltage-mode transmitter 100 is mainly realized by a 3-tap 6-bit FFE 107.

In the data path of the transmitter 100, the PRBS generator 105 is configured to create and transmit 128-bit data D128. The data D128 is in a parallel transmission form. The data D128 includes two 64-bit data MSB and LSB.

The FFE 107 mainly includes output stage circuits 110-1 to 110-3, an output, and a control circuit 150. The output stage circuits 110-1 to 110-3 obtain signals to be transmitted from the previous stage circuit (e.g., the PRBS generator 105). In this embodiment, the output stage circuits 110-2 and 110-3 on the path of the data MSB are composed of twice the output stage circuit 110-1 on the path of the data LSB to provide 2 to 1 weight assignment and maintain linearity for a 4 pulse amplitude modulation (PAM4) signal. In other words, in this embodiment, two output stage circuits 110-2 and 110-3 receive the data MSB, and one output stage circuit 110-1 receives the data LSB. Moreover, the output stage circuits 110-1 to 110-3 have the same circuit structure.

In this embodiment, conversion of a single-ended input into a differential output is taken as an example for the output stage circuits 110-1 to 110-3. As a result, this embodiment includes two outputs Dout and DoutB. The two outputs Dout and DoutB are configured to output differential signals. Those who apply this embodiment may adjust forms of input signals and output signals of the output stage circuits depending on their requirements. For example, the output stage circuits may convert a single-ended input into a single-ended output, a differential input into a single-ended output, a single-ended input into a differential output, or a differential input into a differential output.

In this embodiment, the output stage circuit 110-1 is taken as an example for description. The output stage circuit 110-1 includes a finite impulse response (FIR) generator 120, 64:4 first multiplexers (MUX) 130-1 to 130-3, and a plurality of tap drivers 140-1 to 140-5. The FIR generator 120 is configured to convert input data (e.g., the data LSB) into a list data signal.

The first multiplexers 130-1 to 130-3 are coupled to the FIR generator 120. Each of the first multiplexers 130-1 to 130-3 corresponds to at least one of the tap drivers 140-1 to 140-5. For example, the first multiplexer 130-1 corresponds to a pre-tap driver 140-1; the first multiplexer 130-2 corresponds to main-tap driver 140-2 to 140-4; and the first multiplexer 130-3 corresponds to a post-tap driver 140-5. The first multiplexers 130-1 to 130-3 are configured to sequentially provide the list data signal to at least one of the corresponding tap drivers.

Outputs of the tap drivers 140-1 to 140-5 are coupled to the outputs Dout and DoutB. The tap drivers 140-1 to 140-5 may also be referred to as transmitter front-end circuit slices. The tap driver 140-1 is driven by pre-tap data, and is thus also referred to as a pre-tap driver. The tap drivers 140-2 to 140-4 are driven by main tap data, and are thus also referred to as main-tap drivers. The tap driver 140-5 is driven by post-tap data, and is thus also referred to as a post-tap driver. In this embodiment, the tap drivers 140-1 to 140-5 have the same circuit structure. In this embodiment, the tap driver 140-1 is taken as an example for description.

The tap driver 140-1 includes a single-ended-to-differential (S2D) converter circuit 141-1, a second multiplexer 142-1, and a cell driver 145-1. In other words, the tap drivers 140-1 to 140-5 include respective cell drivers 145-1 to 145-5. The S2D circuit 141-1 is configured to convert a data signal from a single-ended signal form into a differential signal form. The second multiplexer 142-1 is a multiplexer in a form of a differential input and a differential output, and is controlled by the transmitter control circuit 109 to sequentially provide the data signal in a differential signal form to the cell driver 145-1 of the tap driver 140-1.

The control circuit 150 is coupled to the cell drivers 145-1 to 145-5 in the tap drivers 140-1 to 140-5. The control circuit 150 receive control signals CB[5:0] and CP[5:0] to correspondingly control and adjust respective output impedance of the cell drivers 145-1 to 145-5 through providing respective reference voltages of the cell drivers 145-1 to 145-5. The control circuit 150 mainly includes a FFE control loop 151 and an impedance control loop 152. The FFE control loop 151 includes a first replica circuit corresponding to the cell driver included in a part of the tap drivers (e.g., the pre-tap driver 140-1 and the post-tap driver 140-5). The FFE control loop 151 generates one or more first reference voltages according to the first replica circuit. A part of the tap drivers (the pre-tap driver 140-1 and the post-tap driver 140-5) is controlled by the one or more first reference voltages to adjust respective output impedance thereof. The impedance control loop 152 includes a second replica circuit corresponding to the cell drivers 145-1 to 145-5 in the tap drivers 140-1 to 140-5. The impedance control loop 152 generates one or more second reference voltages based on the one or more first reference voltages and the second replica circuit. Another part of the tap drivers (e.g., the main-tap drivers 140-2 to 140-4) is controlled by the one or more second reference voltages to adjust respective output impedance thereof. For detailed operation of the cell drivers 145-1 to 145-5 and the control circuit 150, reference may be made to the following embodiments.

The transmitter control circuit 109 mainly controls the overall data path timing of the voltage-mode transmitter 100. To be specific, the transmitter control circuit 109 controls the PRBS generator 105, the FIR generator 120, the multiplexers 130-1 to 130-3, and the multiplexers 142-1 to 142-5 through various control signals. The transmitter control circuit 109 receives a clock signal CKin, and may include an injection-locked ring oscillator ILRO, a quadrature error corrector (QEC), a duty cycle corrector (DCC), a finite state machine FSM, a duty cycle and phase error detection circuit 109-1, divider circuits 109-2 and 109-3, and the like. Those who apply this embodiment may design the transmitter control circuit 109 depending on their requirements, which not limited to achieving the function of the transmitter control circuit 109 by the elements described in the embodiment of the disclosure.

Figure 2:
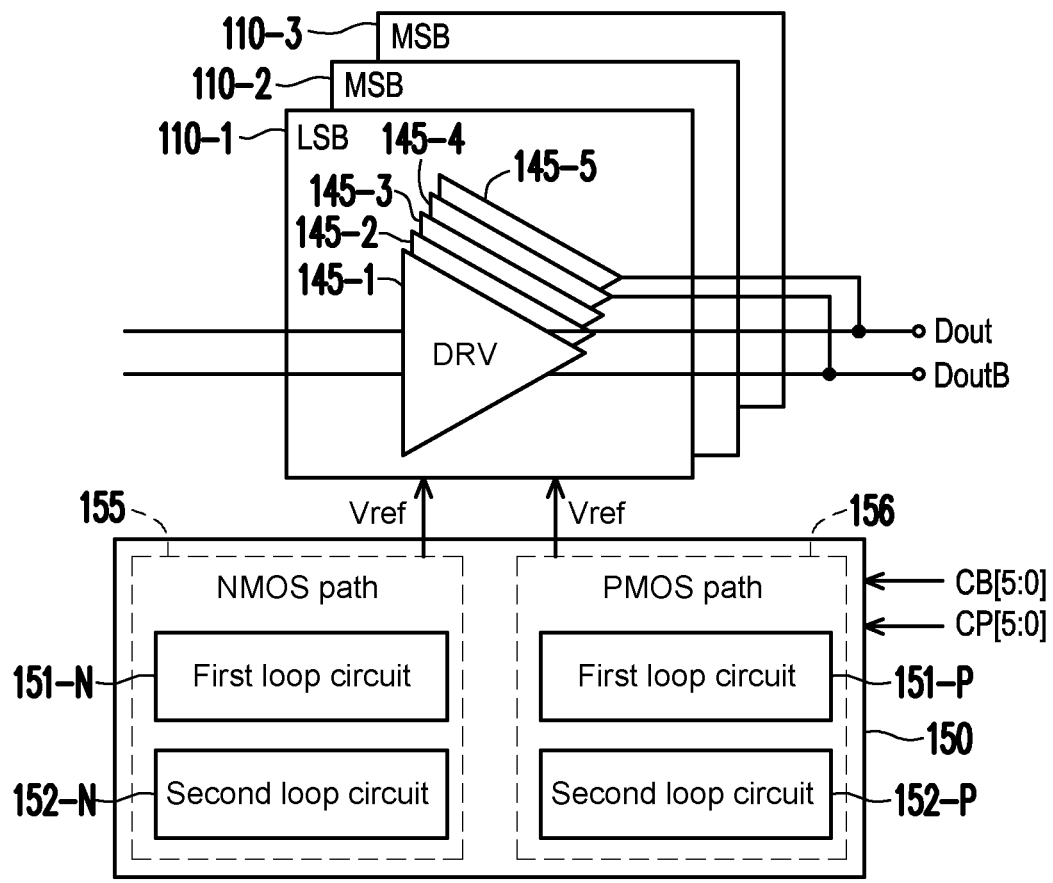
FIG. 2 is a block diagram of a partial circuit of the feed-forward equalizer in FIG. 1.

FIG. 2 is a block diagram of a partial circuit 107-1 of the FFE 107 in FIG. 1. FIG. 2 mainly presents the cell drivers 145-1 to 145-5 in the output stage circuit 110-1, the outputs Dout and DoutB, and the driver circuit 150 as an example for description.

The voltage-mode transmitter 100 in FIG. 1 adopts a source-series terminated driver circuit structure, and is used with an adjustable resistor (e.g., a resistor composed of a transistor) in the cell drivers 145-1 to 145-5 to maintain output impedance and adjust a coefficient of the FFE 107. In terms of the concept of an embodiment of the disclosure, the FFE 107 may be viewed as a voltage summer whose weight is inversely proportional to output impedance of each branch (e.g., each cell driver in the tap drivers). In an embodiment of the disclosure, it is required to adjust the output impedance of the cell drivers 145-1 to 145-5 in the tap drivers (e.g., the tap drivers 140-1 to 140-5 in FIG. 1) to control the coefficient of the FFE 107. Moreover, it should be noted that, since the transistor has a first type transistor (e.g., an N-type metal-oxide-semiconductor (NMOS) field-effect transistor) and a second type transistor (e.g., a P-type metal-oxide-semiconductor (PMOS) field-effect transistor), the corresponding branches (i.e., a first type cell driver and a second type cell driver among the cell drivers) of these two types of transistors in the cell drivers 145-1 to 145-5 require to be controlled, so that the two types of cell drivers provide the same FFE coefficient under data conversion.

The control circuit 150 is configured to generate reference voltages required by the cell drivers 145-1 to 145-5. Each cell driver has a first type path (e.g., an NMOS path 155) and a second type path (e.g., a PMOS path 156), and the control circuit 150 includes the FFE control loop 151 and the impedance control loop 152. As a result, the control circuit 150 in FIG. 2 includes a first loop circuit 151-N and a second loop circuit 152-N belonging to the NMOS path 155, and further includes a first loop circuit 151-P and a second loop circuit 152-P belonging to the PMOS path 156. The first loop circuits 151-N and 151-P are collectively referred to as the FFE control loop 151, and the second loop circuits 152-N and 152-P are collectively referred to as the impedance control loop 152.

The first loop circuits 151-N and 151-P include a first replica circuit corresponding to the cell drivers 145-1 and 145-5 included in a part of the tap drivers (i.e., the pre-tap driver 140-1 and the post-tap driver 140-5 other than the main-tap drivers 140-2 to 140-4). To be more specific, the first replica circuit in the first loop circuit 151-N has the same circuit structure as the circuit structure belonging to the NMOS circuit in the cell drivers 145-1 and 145-5 in the pre-tap driver 140-1 and the post-tap driver 140-5. The first replica circuit in the first loop circuit 151-P has the same circuit structure as the circuit structure belonging to the PMOS circuit in the cell drivers 145-1 and 145-5 in the pre-tap driver 140-1 and the post-tap driver 140-5. The first loop circuits 151-N and 151-P are configured to generate a first reference voltage corresponding to a part of the tap drivers (i.e., the pre-tap driver 140-1 and the post-tap driver 140-5). The second loop circuits 152-N and 152-P are configured to generate a second reference voltage corresponding to the main-tap drivers 140-2 to 140-4 in FIG. 1.

The control signal received by the control circuit 150 includes a first coefficient control signal CB[5:0] and a second coefficient control signal CP[5:0]. The first coefficient control signal CB[5:0] is used to adjust array impedance in the first loop circuit 151-N corresponding to the pre-tap driver 140-1 in FIG. 1 to adjust a first tap weight of the corresponding cell driver 145-1 in the pre-tap driver 140-1. The second coefficient control signal CP[5:0] is used to adjust array impedance in the first loop circuit 151-N corresponding to the post-tap driver 140-5 in FIG. 1 to adjust a second tap weight of the corresponding cell driver 145-5 in the post-tap driver 140-5. For the detailed circuit structures of the first loop circuits 151-N and 151-P and the second loop circuits 152-N and 152-P, reference may be made to FIG. 3.

Figure 3:
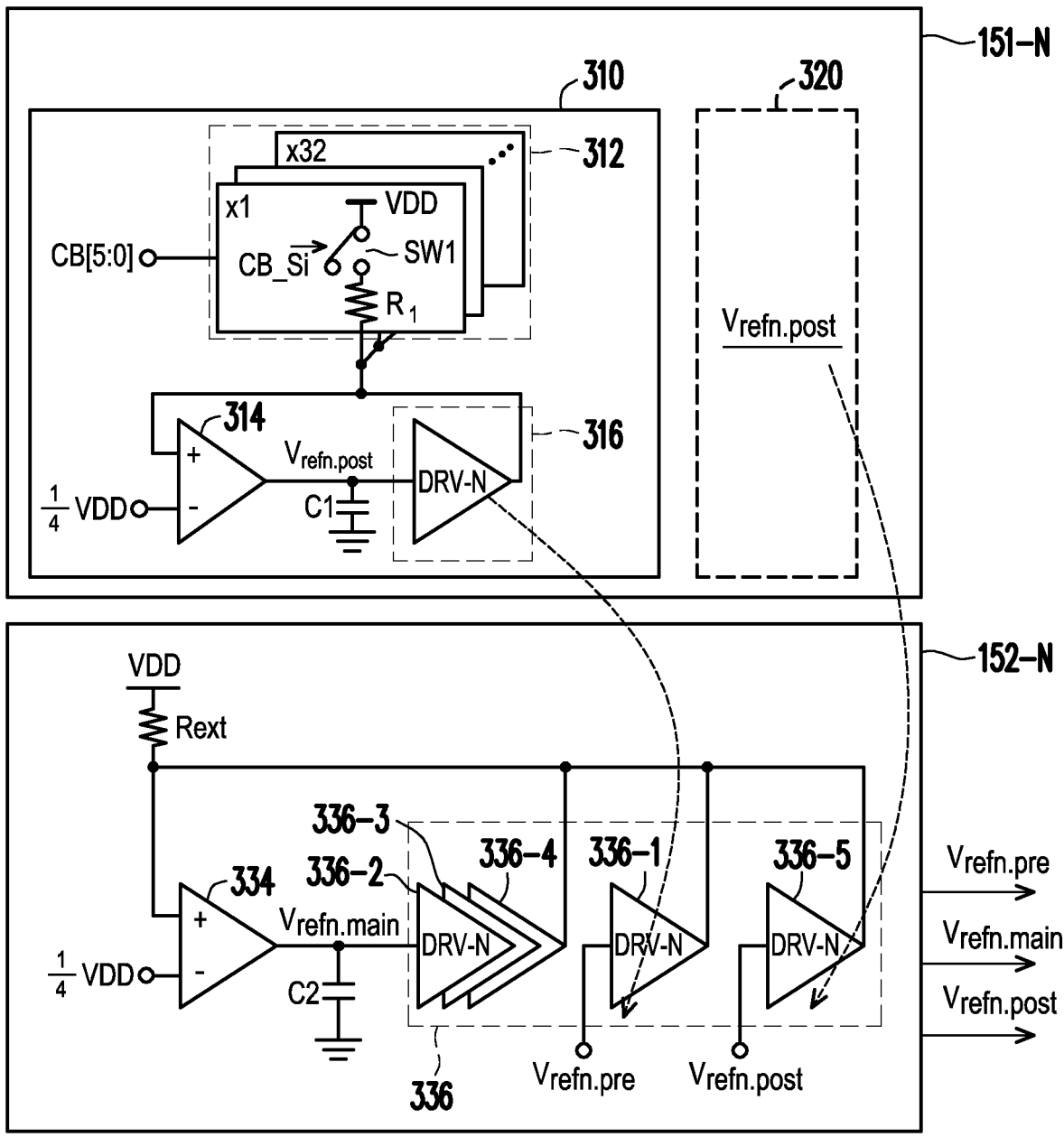
FIG. 3 is a detailed circuit diagram of the first loop circuit and the second loop circuit belonging to the NMOS path in FIG. 2.

FIG. 3 is a detailed circuit diagram of the first loop circuit 151-N and the second loop circuit 152-N belonging to the NMOS path 155 in FIG. 2. The first loop circuit 151-N in FIG. 3 is further divided into a first loop circuit 310 corresponding to the cell driver 145-1 in the pre-tap driver 140-1 in FIG. 1 and a first loop circuit 320 corresponding to the cell driver 145-5 in the post-tap driver 140-5 in FIG. 1. In this embodiment, the first loop circuits 310 and 320 have the same circuit structure. Here, the first loop circuit 310 is first taken as an example for description.

The first loop circuit 310 mainly includes a resistor array 312, a first operational amplifier 314, and a first replica circuit 316. The resistor array 312 is coupled to the first coefficient control signal CB[5:0], and a connecting terminal of the resistor array 312 is coupled to a second input (e.g., a non-inverting terminal) of the first operational amplifier 314 and an output of the first replica circuit 316. A first input (e.g., an inverting terminal) of the first operational amplifier 314 is coupled to a first reference terminal (here, ¼ VDD is taken as an example of the first reference terminal). An output of the first operational amplifier 314 is coupled to an input of the first replica circuit 316.

The resistor array 312 is controlled by a control signal (e.g., the first coefficient control signal CB[5:0]) to adjust array impedance of the resistor array 312. To be specific, the resistor array 312 includes a plurality of resistor units. In this embodiment, 32 resistor units are taken as an example. Each resistor unit includes a switch (e.g., a switch SW1) and a resistor (e.g., a resistor R1). Taking the switch SW1 and the resistor R1 as an example, a first terminal of the switch SW1 is coupled to the system voltage VDD, and a second terminal of the switch SW1 is coupled to one end of the resistor R1. The first coefficient control signal CB[5:0] may generate 32 control signals CB_Si, and each control signal CB_Si is correspondingly coupled to a control terminal of the switch S1. The other ends of the resistors in the resistor units are coupled to each other. The number of resistors connected in parallel in the 32 resistor units is adjusted through the first coefficient control signal CB[5:0] to adjust the array impedance of the resistor array 312 in the first loop circuit 310.

The output of the first operational amplifier 314 generates a first reference voltage Vrefn.pre. The first loop circuit 310 further includes a capacitor C1. The capacitor C1 is coupled between the output of the first operational amplifier 314 and the ground.

The first replica circuit 316 has the same circuit structure as the circuit structure belonging to the NMOS circuit in the cell driver 145-1 in the pre-tap driver 140-1.

The first loop circuit 320 and the first loop circuit 310 have the same circuit structure, and their difference is that a first replica circuit in the first loop circuit 320 has the same circuit structure as the circuit structure belonging to the NMOS circuit in the cell driver 145-5 in the post-tap driver 140-5, and an output of a first operational amplifier in the first loop circuit 320 generates a first reference voltage Vrefn.post. Moreover, a resistor array in the first loop circuit 320 is coupled to and controlled by the second coefficient control signal CP[5:0].

As a result, based on the circuit structure of the first loop circuits 310 and 320, the first operational amplifiers fix the connecting terminals to the voltage value corresponding to the first reference terminal at ¼ VDD (¼ VDD is taken as an example of the first reference terminal), and the reference voltage (e.g., the first reference voltages Vrefn.pre and Vrefn.post) corresponding to the variable resistance value can be created by the FFE control loop. In this way, by adjusting the first coefficient control signal CB[5:0] and the second coefficient control signal CP[5:0], the weights of the tap drivers 140-1 to 140-5 in FIG. 1 may correspondingly adjust the first reference voltages Vrefn.pre and Vrefn.post accordingly. Each of the tap drivers 140-1 to 140-5 can realize a high-resolution (e.g., 6-bit) FFE with one of the cell drivers 145-1 to 145-5.

The second loop circuit 152-N mainly includes a second replica circuit 336 corresponding to the NMOS circuits in the cell drivers 145-1 to 145-5 in the tap drivers and a second operational amplifier 334. To be specific, the second replica circuit 336 has the same circuit structure as the circuit structure belonging to the NMOS circuit in the cell drivers 145-1 to 145-5 in the tap drivers 140-1 to 140-5. The second replica circuit 336 includes a replica circuit 336-1 with the same structure as the cell driver 145-1 in FIG. 1, a replica circuit 336-5 with the same structure as the cell driver 145-5 in FIG. 1, and replica circuits 336-2 to 336-4 with the same structure as the cell drivers 145-2 to 145-4 in FIG. 1. An input of the replica circuit 336-1 receives the first reference voltage Vrefn.pre from the first loop circuit 151-N, and an input of the replica circuit 336-5 receives the first reference voltage Vrefn.post from the first loop circuit 151-N.

A first input (e.g., an inverting terminal) of the second operational amplifier 334 is coupled to a first reference terminal (here. ¼ VDD is taken as an example of the first reference terminal). A second input (e.g., a non-inverting terminal) of the second operational amplifier 334 is coupled to a plurality of outputs of the replica circuits 336-1 to 336-5 in the second replica circuit 336. An output of the second operational amplifier 334 is coupled to inputs of the replica circuits 336-2 to 336-4. The output of the second operational amplifier 334 generates a second reference voltage Vrefn.main.

The second loop circuit 152-N further includes an external resistor Rext. One end of the external resistor Rext is coupled to the system voltage VDD, and the other end of the external resistor Rext is coupled to the first input (e.g., the inverting terminal) of the second operational amplifier 334. In this embodiment, the external resistor Rext may be realized by a 450-ohm resistor. The second loop circuit 152-N further includes a capacitor C2. The capacitor C2 is disposed between the output of the second operational amplifier 334 and the ground.

The second loop circuit 152-N of the impedance control loop includes the second replica circuit 336 of each of the cell drivers 145-1 to 145-5 in the output stage circuit 110-1 in FIG. 1, the external resistor Rext, and the second operational amplifier 334 for realizing a negative feedback loop. Since output impedance of the pre-tap driver 140-1 and the post-tap driver 140-5 in FIG. 1 has been fixed by the first reference voltages Vrefn.pre and Vrefn.post generated based on the first loop circuits 310 and 320, output impedance matching of the transmitter 100 in FIG. 1 can be realized by adjusting the weights of the main-tap drivers 140-2 to 140-4 in FIG. 1 through the second reference voltage Vrefn.main. In this embodiment, after the second operational amplifier 334 is utilized to fix the voltage on the non-inverting terminal thereof to ¼ VDD, output impedance of the output stage circuit 110-1 in FIG. 1 can be locked to 150 ohms.

Figure 5:
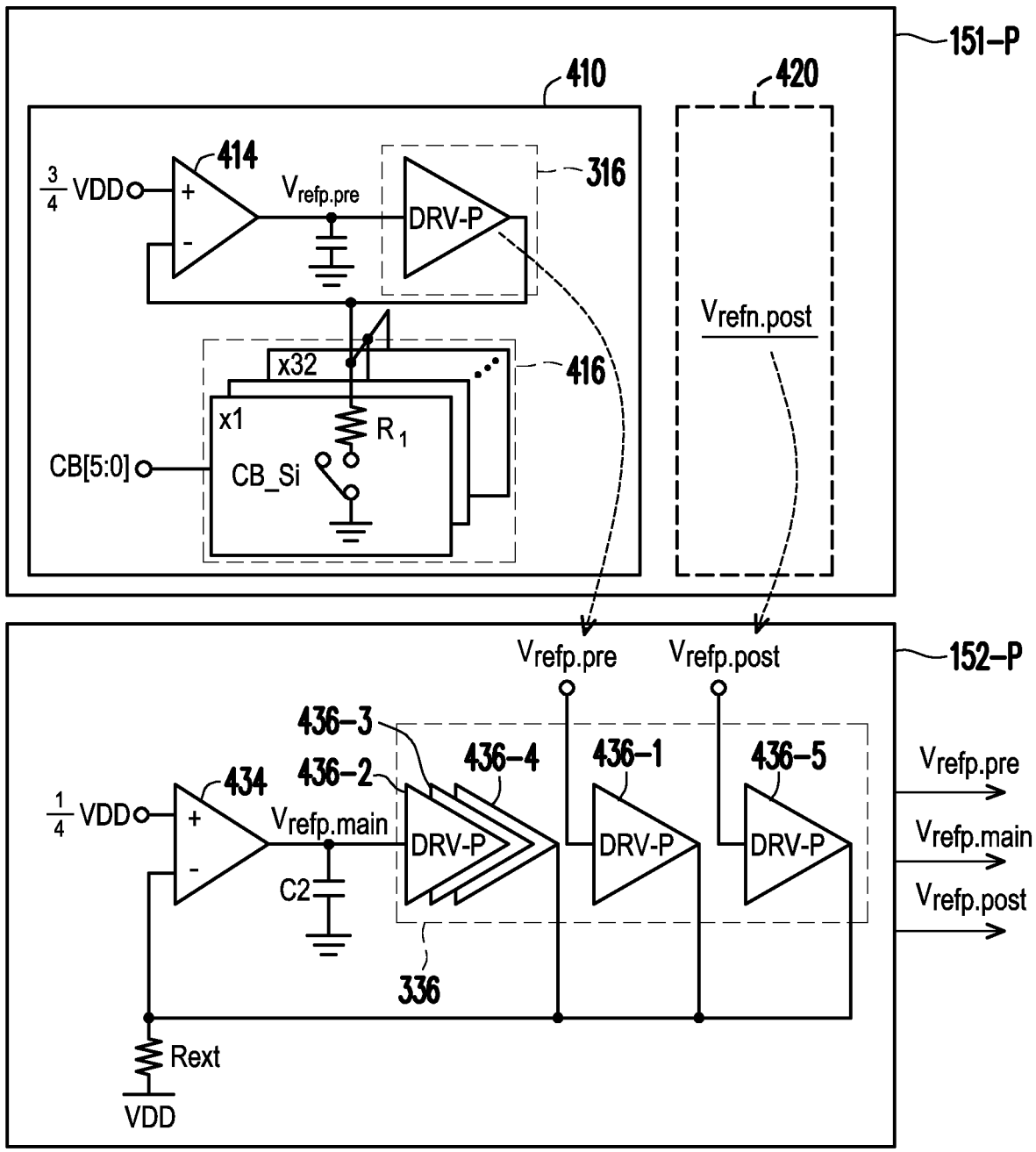
FIG. 5 is a detailed circuit diagram of the first loop circuit and the second loop circuit belonging to the PMOS path in FIG. 2.

Control loop branches corresponding to the cell drivers 145-1 to 145-5 are also realized similarly. FIG. 5 is a detailed circuit diagram of the first loop circuit 151-P and the second loop circuit 152-P belonging to the PMOS path 156 in FIG. 2. The main difference between FIG. 5 and FIG. 3 is that a PMOS circuit is taken for realization in FIG. 5, and an NMOS circuit is taken for realization in FIG. 3.

A first loop circuit 410 mainly includes a resistor array 412, a first operational amplifier 414, and a first replica circuit 416. The resistor array 412 is controlled by a control signal (e.g., the first coefficient control signal CB[5:0]) to adjust array impedance of the resistor array 412. The resistor array 412 is coupled to the first coefficient control signal CB[5:0]. A first input (e.g., an inverting terminal) of the first operational amplifier 414 is coupled to a first reference terminal (here, ¾ VDD is taken as an example of the first reference terminal). The first replica circuit 416 has the same circuit structure as the circuit structure belonging to the PMOS circuit in the cell driver 145-1 in the pre-tap driver 140-1. An output of the first operational amplifier 414 generates a first reference voltage Vrefp.pre. The first loop circuit 410 further includes a capacitor C1. The capacitor C1 is coupled between the output of the first operational amplifier 414 and the ground.

A first loop circuit 420 and the first loop circuit 410 have the same circuit structure, and their difference is that a first replica circuit in the first loop circuit 420 has the same circuit structure as the circuit structure belonging to the PMOS circuit in the cell driver 145-5 in the post-tap driver 140-5, and an output of a first operational amplifier in the first loop circuit 420 generates a first reference voltage Vrefp.post. Moreover, a resistor array in the first loop circuit 420 is coupled to and controlled by the second coefficient control signal CP[5:0].

The second loop circuit 152-P mainly includes a second replica circuit 436 corresponding to the PMOS circuits in the cell drivers 145-1 to 145-5 in the tap drivers and a second operational amplifier 434. The second replica circuit 436 includes a replica circuit 436-1 with the same structure as the cell driver 145-1 in FIG. 1, a replica circuit 436-5 with the same structure as the cell driver 145-5 in FIG. 1, and replica circuits 436-2 to 436-4 with the same structure as the cell drivers 145-2 to 145-4 in FIG. 1. An input of the replica circuit 436-1 receives the first reference voltage Vrefp.pre from the first loop circuit 151-P. and an input of the replica circuit 436-5 receives the first reference voltage Vrefp.post from the first loop circuit 151-P. A first input (e.g., an inverting terminal) of the second operational amplifier 434 is coupled to a first reference terminal (here. ¾ VDD is taken as an example of the first reference terminal). An output of the second operational amplifier 434 generates a second reference voltage Vrefp.main. The second loop circuit 152-P further includes an external resistor Rext and a capacitor C2. For operation of the first loop circuits 410 and 420 and the second loop circuit 152-P, reference may be made to the corresponding description of the first loop circuits 310 and 320 and the second loop circuit 152-N above.

Figure 4:
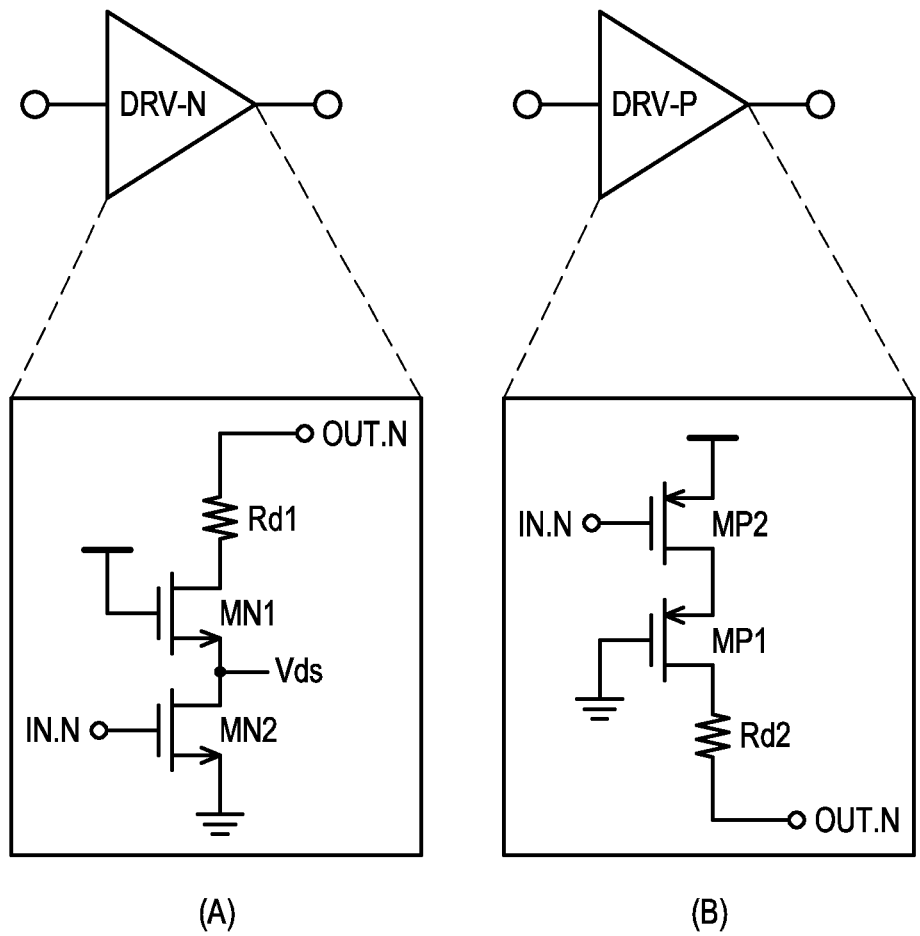
FIG. 4 is a schematic circuit diagram of a first type cell driver and a second type cell driver.

FIG. 4 is a schematic circuit diagram of a first type cell driver DRV-N and a second type cell driver DRV-P. Part (A) in FIG. 4 presents the first type cell driver DRV-N(i.e., the cell driver belonging to the NMOS circuit), and part (B) in FIG. 4 presents the second type cell driver DRV-P (i.e., the cell driver belonging to the PMOS circuit). The cell driver in each replica circuit in FIG. 3 belongs to the first type cell driver DRV-N. The cell driver in each replica circuit in FIG. 5 belongs to the second type cell driver DRV-P.

Part (A) in FIG. 4 will be described in detail. The first type cell driver DRV-N has a circuit structure including a resistor Rd1, a first transistor MN1, and a second transistor MN2. A first terminal of the resistor Rd1 is coupled to an output OUT.N of the cell driver DRV-N. A control terminal of the first transistor MN1 is coupled to a second reference terminal (here, VDD is taken as an example of the second reference terminal). A first terminal of the first transistor MN1 is coupled to a second terminal of the resistor Rd1. A control terminal of the second transistor MN2 is coupled to an input IN.N of the cell driver DRV-N, a first terminal of the second transistor MN2 is coupled to a second terminal of the first transistor MN1, and a second terminal of the second transistor MN2 is coupled to a third reference terminal (here, the ground is taken as an example of the/third reference terminal). The voltage on the first terminal of the second transistor MN2 is referred to as a voltage Vds.

Part (B) in FIG. 4 will be described in detail. The second type cell driver DRV-P has a circuit structure including a resistor Rd2, a transistor MP1, and a transistor MP2. A first terminal of the resistor Rd2 is coupled to an output OUT.P of the cell driver DRV-P. A control terminal of the transistor MP1 is coupled to a second reference terminal (here, the ground is taken as an example of the second reference terminal). A first terminal of the transistor MP1 is coupled to a second terminal of the resistor Rd2. A control terminal of the transistor MP2 is coupled to an input IN.P of the cell driver DRV-P, a first terminal of the transistor MP2 is coupled to a second terminal of the transistor MP1, and a second terminal of the transistor MP2 is coupled to a third reference terminal (here. VDD is taken as an example of the third reference terminal).

Figure 6:
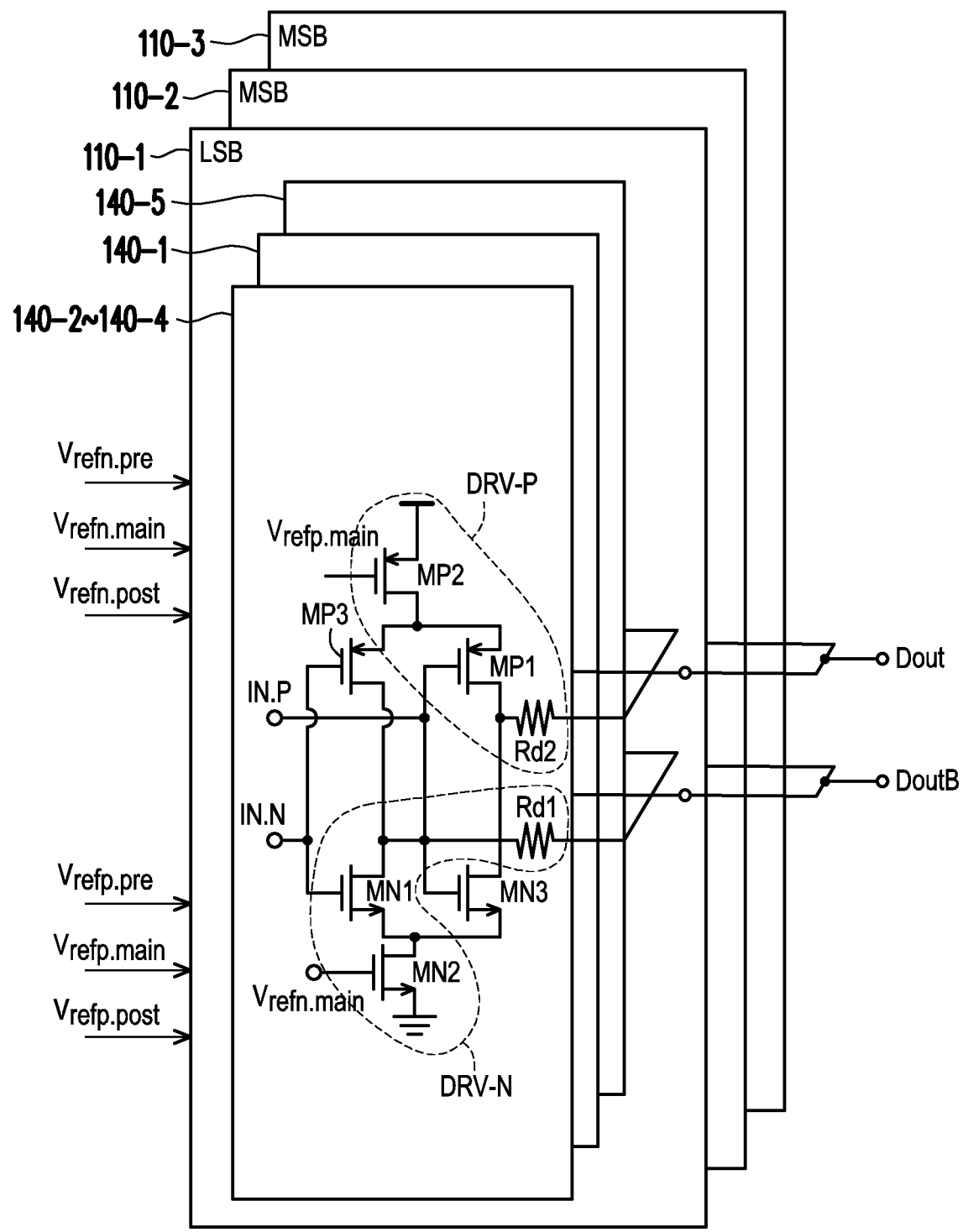
FIG. 6 is a schematic circuit diagram of the cell drivers in FIG. 1.

FIG. 6 is a schematic circuit diagram of the cell drivers 145-1 to 145-5 in FIG. 1. In FIG. 6, each of the output stage circuits 110-1 to 110-3 includes the cell drivers 145-1 to 145-5 corresponding to the tap drivers 140-1 to 140-5. The cell drivers 145-1 to 145-5 have the same circuit structure, so the cell driver 145-2 is taken as an example for description of FIG. 6.

The cell driver 145-2 mainly includes the first type cell driver DRV-N belonging to the NMOS circuit and the second type cell driver DRV-P belonging to the PMOS circuit. The cell driver 145-2 further includes a third transistor MN3 and a fourth transistor MP3. The first type cell driver DRV-N and the second type cell driver DRV-P have been illustrated in FIG. 4.

A control terminal of the third transistor MN3 is coupled to the input IN.P of the second type cell driver DRV-P, a first terminal of the third transistor MN3 is coupled to the second terminal of the resistor Rd2 in the second type cell driver DRV-P. and a second terminal of the third transistor MN3 is coupled to the second terminal of the first transistor MN1 and the first terminal of the second transistor MN2 in the first type cell driver DRV-N.

A control terminal of the fourth transistor MP3 is coupled to the input IN.N of the first type cell driver DRV-N, a first terminal of the fourth transistor MP3 is coupled to the second terminal of the resistor Rd1 in the second type cell driver DRV-P, and a second terminal of the fourth transistor MP3 is coupled to the second terminal of the transistor MP2 in the second type cell driver DRV-P. The input IN.N of the first type cell driver DRV-N and the input IN.P of the second type cell driver DRV-P respectively receive the corresponding first reference voltage or the corresponding second reference voltage. In this embodiment, the cell drivers 145-2 to 145-4 correspond to the FFE control loop 151 in FIG. 1, so the input IN.N and the input IN.P of the cell drivers 145-2 to 145-4 respectively receive the second reference voltages Vrefn.main and Vrefp.main.

Comparatively, in this embodiment, the cell driver 145-1 corresponds to the impedance control loop 152 in FIG. 1, so the input IN.N and the input IN.P respectively receive the first reference voltages Vrefn.pre and Vrefp.pre. In this embodiment, the cell driver 145-5 corresponds to the impedance control loop 152 in FIG. 1, so the input IN.N and the input IN.P respectively receive the first reference voltages Vrefn.post and Vrefp.post.

Figure 7:
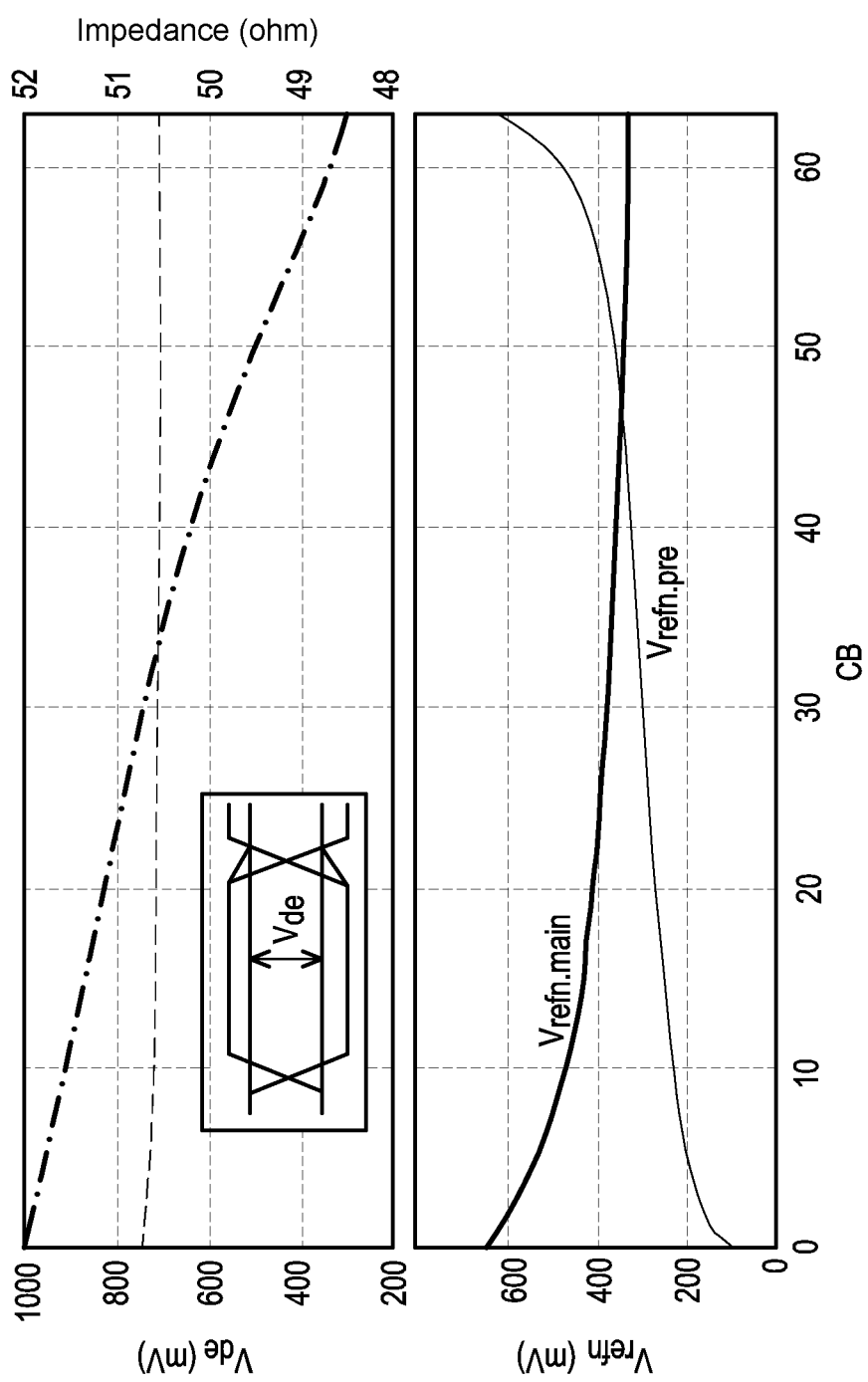
FIG. 7 is a schematic waveform diagram of a de-emphasized voltage, output impedance, and a corresponding reference voltage of a post-tap driver simulated under different control signals according to an embodiment of the disclosure.

FIG. 7 is a schematic waveform diagram of a de-emphasized voltage Vde, output impedance, and a corresponding reference voltage of a post-tap driver simulated under different control signals according to an embodiment of the disclosure. The de-emphasized voltage Vde refers to the voltage difference between the two outputs Dout and DoutB in the voltage-mode transmitter 100 during de-emphasis. By setting the resistor R1 in the resistor arrays 312 and 412 in FIG. 3 and FIG. 5 to 85 k ohms, in the case where a voltage of the system voltage VDD is 1V, the de-emphasized voltage Vde may vary within a range from 1V (corresponding to 0 dB) to 0.31V (corresponding to 10.2 dB), showing relatively good linearity. Moreover, as the reference voltage Vrefn.pre is increased, a relatively large de-emphasized voltage Vde may also be realized, and the corresponding reference voltage Vrefn.main is reduced to maintain the overall output impedance of the transmitter 100 in FIG. 1, realizing FFE coefficient adjustment and also driver output impedance correction. In other embodiments of the disclosure, if the outputs Dout and DoutB in the voltage-mode transmitter 100 generate high-frequency signals, de-emphasis may not be required.

In summary of the foregoing, according to an embodiment of the disclosure, the FFE and the voltage-mode signal transmitter using the same achieve FFE coefficient adjustment and also driver output impedance correction by the control circuit, reducing the number of cell drivers in the FFE. In other words, in an embodiment of the disclosure, FFE coefficient control is integrated into the impedance control loop in the control circuit, which prevents segmentation of the driver into several cell drivers to control the FFE coefficient. Moreover, resolution of the FFE coefficient is not limited by the bandwidth of the driver and the power consumption of the transmitter.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A feed-forward equalizer adapted for a voltage-mode signal transmitter, the feed-forward equalizer comprising:
   an output;
   a plurality of tap drivers, wherein outputs of the tap drivers are coupled to the output, and each of the tap drivers comprises a cell driver; and
   a control circuit coupled to the cell driver in each of the tap drivers, wherein the control circuit comprises:
      a feed-forward equalizer control loop comprising a first replica circuit corresponding to the cell driver comprised in a part of the tap drivers, wherein the feed-forward equalizer control loop generates at least one first reference voltage according to the first replica circuit, wherein the part of the tap drivers is controlled by the at least one first reference voltage to adjust respective output impedance thereof; and
      an impedance control loop comprising a second replica circuit corresponding to the cell drivers in the tap drivers, wherein the impedance control loop generates at least one second reference voltage according to the at least one first reference voltage and the second replica circuit, wherein another part of the tap drivers is controlled by the at least one second reference voltage to adjust respective output impedance thereof.

2. The feed-forward equalizer according to claim 1, wherein the tap drivers comprise a pre-tap driver, at least one main-tap driver, and a post-tap driver.

3. The feed-forward equalizer according to claim 2, wherein the feed-forward equalizer control loop comprises a plurality of first loop circuits, wherein each of the first loop circuits corresponds to the pre-tap driver or the post-tap driver in the tap drivers, and each of the first loop circuits comprises the first replica circuit corresponding to the cell driver in the pre-tap driver or the post-tap driver,
   wherein the impedance control loop comprises a second loop circuit, wherein the second loop circuit corresponds to the at least one main-tap driver in the tap drivers, and the second loop circuit comprises the second replica circuit corresponding to the cell drivers in the tap drivers.

4. The feed-forward equalizer according to claim 3, wherein each of the first loop circuits further comprises:
   a resistor array controlled by a control signal to adjust array impedance of the resistor array, wherein a connecting terminal of the resistor array is coupled to an output of the first replica circuit; and
   a first operational amplifier, wherein a first input of the first operational amplifier coupled to a first reference terminal, a second input of the first operational amplifier is coupled to the connecting terminal of the resistor array and the output of the first replica circuit, and an output of the first operational amplifier is coupled to an input of the first replica circuit,
   wherein the output of the first operational amplifier generates the at least one first reference voltage.

5. The feed-forward equalizer according to claim 4, wherein the second loop circuit further comprises:
   a second operational amplifier, wherein a first input of the second operational amplifier is coupled to the first reference terminal, a second input of the second operational amplifier is coupled to a plurality of outputs of the cell drivers in the second replica circuit, and an output of the second operational amplifier is coupled to at least one input of the cell driver of the at least one main-tap driver in the second replica circuit,
   wherein the output of the second operational amplifier generates the at least one second reference voltage.

6. The feed-forward equalizer according to claim 1, wherein the cell driver comprises a first type cell driver and a second type cell driver, and
   a control signal received by the control circuit comprises a first coefficient control signal and a second coefficient control signal,
   wherein the first coefficient control signal is used to adjust array impedance in a first loop circuit corresponding to a pre-tap driver in the feed-forward equalizer control loop to adjust a first tap weight of the corresponding cell driver in the pre-tap driver, and
   the second coefficient control signal is used to adjust array impedance in a second loop circuit corresponding to a post-tap driver in the feed-forward equalizer control loop to adjust a second tap weight of the corresponding cell driver in the post-tap driver.

7. The feed-forward equalizer according to claim 6, wherein the first type cell driver or the second type cell driver has a circuit structure comprising:
   a first resistor, wherein a first terminal of the first resistor is coupled to an output of the circuit structure;
   a first transistor, wherein a control terminal of the first transistor is coupled to a second reference terminal, and a first terminal of the first transistor is coupled to a second terminal of the first resistor; and
   a second transistor, wherein a control terminal of the second transistor is coupled to an input of the circuit structure, a first terminal of the second transistor is coupled to a second terminal of the first transistor, and a second terminal of the second transistor is coupled to a third reference terminal.

8. The feed-forward equalizer according to claim 7, wherein the cell driver further comprises:
   a third transistor, wherein a control terminal of the third transistor is coupled to an input of the second type cell driver, a first terminal of the third transistor is coupled to the second terminal of the first resistor in the second type cell driver, and a second terminal of the third transistor is coupled to the second terminal of the first transistor in the first type cell driver; and
   a fourth transistor, wherein a control terminal of the fourth transistor is coupled to an input of the first type cell driver, a first terminal of the fourth transistor is coupled to the second terminal of the first resistor in the first type cell driver, and a second terminal of the fourth transistor is coupled to the second terminal of the first transistor in the second type cell driver,
   wherein the input of the first type cell driver and the input of the second type cell driver respectively receive the corresponding at least one first reference voltage or the corresponding second reference voltage.

9. The feed-forward equalizer according to claim 1, further comprising:
   a finite impulse response generator configured to convert input data into a list data signal; and
   a plurality of first multiplexers coupled to the finite impulse response generator, wherein each of the first multiplexers corresponds to at least one of the tap drivers, and sequentially provides the list data signal to the corresponding at least one of the tap drivers.

10. The feed-forward equalizer according to claim 1, wherein the first replica circuit in the feed-forward equalizer control loop and the cell driver comprised in the part of the tap drivers have the same circuit structure, and the second replica circuit and the cell drivers in the tap drivers have the same circuit structure.

11. The feed-forward equalizer according to claim 1, wherein each of the tap drivers further comprises:
a single-ended-to-differential converter circuit converting a data signal from a single-ended signal form into a differential signal form; and
a second multiplexer coupled to the single-ended-to-differential converter circuit, and sequentially providing the data signal in the differential signal form to the cell drivers.

12. A voltage-mode signal transmitter comprising the feed-forward equalizer according to claim 1.

* * * * *